(12) United States Patent
Zhang et al.

(10) Patent No.: US 7,297,557 B2
(45) Date of Patent: *Nov. 20, 2007

(54) METHOD FOR CHEMICALLY BONDING LANGMUIR-BLODGETT FILMS TO SUBSTRATES

(75) Inventors: Sean X. Zhang, Sunnyvale, CA (US); Zhang-lin Zhou, Mountain View, CA (US); Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 232 days.

This patent is subject to a terminal disclaimer.

(21) Appl. No.: 10/880,482

(22) Filed: Jun. 30, 2004

(65) Prior Publication Data

US 2006/0002176 A1    Jan. 5, 2006

(51) Int. Cl.
*H01L 21/00* (2006.01)
*H01L 21/31* (2006.01)
*C12Q 1/70* (2006.01)

(52) U.S. Cl. .......... 438/1; 438/758; 977/708; 435/6; 257/E21.265

(58) Field of Classification Search .......... 438/1, 438/758; 977/708; 435/6
See application file for complete search history.

(56) References Cited

U.S. PATENT DOCUMENTS

| 6,128,214 | A | 10/2000 | Kuekes et al. | |
|---|---|---|---|---|
| 6,459,095 | B1 | 10/2002 | Heath et al. | |
| 6,674,932 | B1 | 1/2004 | Zhang et al. | |
| 2002/0176276 | A1* | 11/2002 | Zhang et al. | 365/151 |
| 2006/0003594 | A1* | 1/2006 | Zhang et al. | 438/758 |

FOREIGN PATENT DOCUMENTS

| EP | 0252756 | 1/1988 |
|---|---|---|
| EP | 0284314 | 9/1988 |

OTHER PUBLICATIONS

Donhauser, Z.J. et al., "Conductance Switching in Single Molecules Through Conformational Changes", Science, Aug. 22, 2001, vol. 292, No. 5525, pp. 2303-2307.
Blinov, L.M., "Langmuir-Films", Soviet Physics Uspekhi, American Institute of Physics, New York, US, vol. 31, No. 7, Jul. 1, 1988, pp. 623-641.

* cited by examiner

*Primary Examiner*—Michael Lebentritt
*Assistant Examiner*—Ron Pompey

(57) ABSTRACT

A method of attaching a molecular layer to a substrate includes attaching a temporary protecting group(s) to a molecule having a molecular switching moiety with first and second connecting groups attached to opposed ends thereof. The temporary protecting group(s) is attached to the first and/or second connecting group so as to cause the opposed ends of the switching moiety to exhibit a difference in hydrophilicity such that one of the ends remains at at least one of a water/solvent interface and a water/air interface, and the other end remains in air during a Langmuir-Blodgett (LB) process. An LB film is formed on the interface. The temporary protecting group(s) is removed. The substrate is passed through the LB film to form the molecular layer chemically bonded on the substrate. The difference in hydrophilicity between the opposed ends causes formation of a substantially well-oriented, uniform LB film at the interface.

41 Claims, 7 Drawing Sheets

FIG. 5B

METHOD FOR CHEMICALLY BONDING LANGMUIR-BLODGETT FILMS TO SUBSTRATES

BACKGROUND OF THE INVENTION

The present disclosure relates generally to molecular electronics, and more particularly to molecular layers formed using Langmuir-Blodgett methods.

Molecular devices having two electrodes (for example, a bottom electrode and a top electrode) and a molecular switching layer or film at the junction of the two electrodes are known. Such devices may be useful, for example, in the fabrication of devices based on electrical switching, such as molecular wire crossbar interconnects for signal routing and communications, molecular wire crossbar memory, molecular wire crossbar logic employing programmable logic arrays, multiplexers or demultiplexers for molecular wire crossbar networks, molecular wire transistors, and the like. Such devices may further be useful, for example, in the fabrication of devices based on optical switching, such as displays, electronic books, rewritable media, electrically tunable optical lenses, electrically controlled tinting for windows and mirrors, optical crossbar switches (for example, for routing signals from one of many incoming channels to one of many outgoing channels), and the like.

Typically, the molecular switching layer or film has an organic molecule that, in the presence of an electrical (E) field, switches between two or more energetic states, such as by an electro-chemical oxidation or reduction (redox) reaction or by a change in the band gap of the molecule induced by the applied E-field.

It is important to form a good electrical contact between the electrode and the molecular switching layer in order to fabricate operative molecular devices. Molecules with special chemical end groups are able to form direct chemical bonds with metal or semiconductor electrodes to form a self-assembled monolayer (SAM), which may have a good electrical contact with an electrode(s). However, this self-assembled molecular layer formed on the surface of the electrode may generally be prone to a high density of defects. If a second electrode is formed on the molecular layer, then an electrical short may occur between the first and second electrode through the defects in the self-assembled molecular layer.

The formation of Langmuir-Blodgett (LB) layers or films employing switching molecules has been attempted because such layers or films are generally much denser than SAM films. Further, LB layers or films have relatively low defect densities compared to SAM films. However, it has proven to be a significant challenge to effectively bond LB films to the electrode substrate. As such, if the LB film is not sufficiently bonded to the electrode(s), then poor electrical contact may result.

As such, there is a need for providing a high density molecular switching layer on an electrode(s), which layer also bonds well with the electrode.

SUMMARY

A method of attaching a molecular layer to a substrate includes attaching at least one temporary protecting group to a molecule having a molecular switching moiety, the switching moiety having first and second connecting groups attached to opposed ends of the moiety. The temporary protecting group(s) is attached to at least one of the first and second connecting groups so as to cause the opposed ends of the switching moiety to exhibit a difference in hydrophilicity such that one of the ends remains at at least one of a water/solvent interface and a water/air interface, and the other end remains in air during a Langmuir-Blodgett (LB) process. An LB film of the molecule is formed on the at least one of the water/solvent interface and the water/air interface. The temporary protecting group(s) is removed. The substrate is passed through the Langmuir-Blodgett film to form the molecular layer chemically bonded on the substrate. The difference in hydrophilicity between the opposed ends of the switching moiety causes formation of a substantially well-oriented, uniform LB film at the at least one of the water/solvent interface and the water/air interface.

BRIEF DESCRIPTION OF THE DRAWINGS

Objects, features and advantages will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

FIG. 1B is a perspective elevational view, depicting the crossed-wire device shown in FIG. 1a;

FIGS. 5A-5B is similar to FIG. 3, but depicts yet a further alternate embodiment of a method of the present invention.

DETAILED DESCRIPTION

Embodiments of the present invention advantageously use a novel concept of hydrophilicity modification. This concept takes advantage of the advantageous qualities of self-assembly techniques (e.g. good electrical contact due to chemical bonding) and Langmuir-Blodgett (LB) deposition (e.g. low defect density). The concept further substantially eliminates problems that may in some instances be associated with both methods. The method according to embodiments of the present invention provides a good Langmuir-Blodgett film(s), orienting the connecting groups at the ends of the molecule forming the film(s), such that chemical bonding and the formation of good electrical contact with the crossbar electrodes at either end of the molecule is promoted (described in further detail below, also for example with reference to FIGS. 4-6).

Figure 1A:
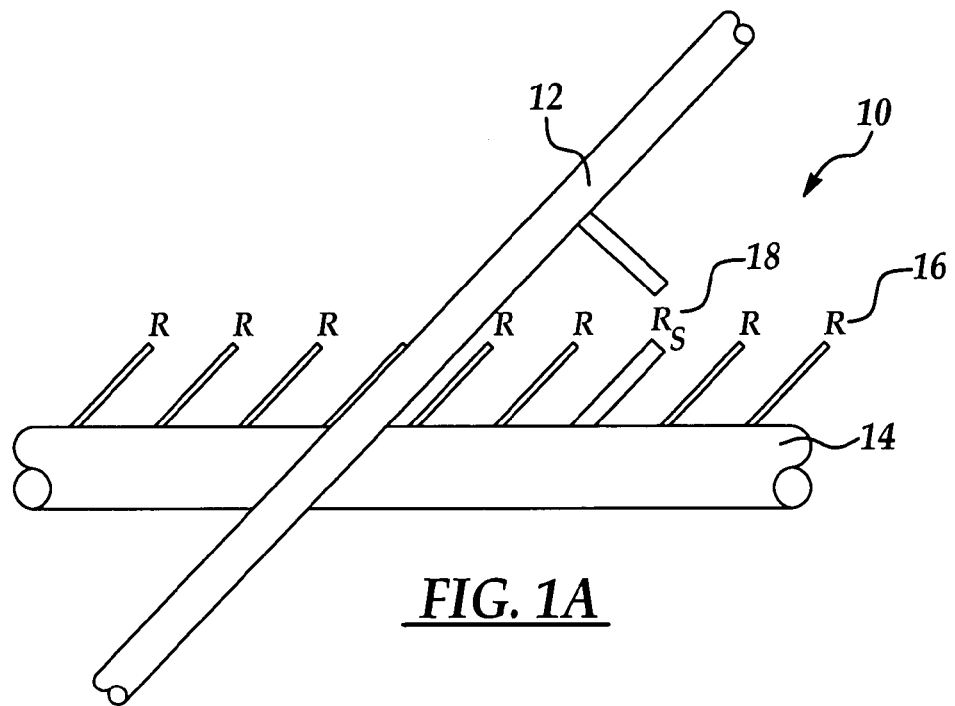
FIG. 1A is a schematic representation of two crossed wires, with at least one molecule at the intersection of the two wires.
Figure 1B:
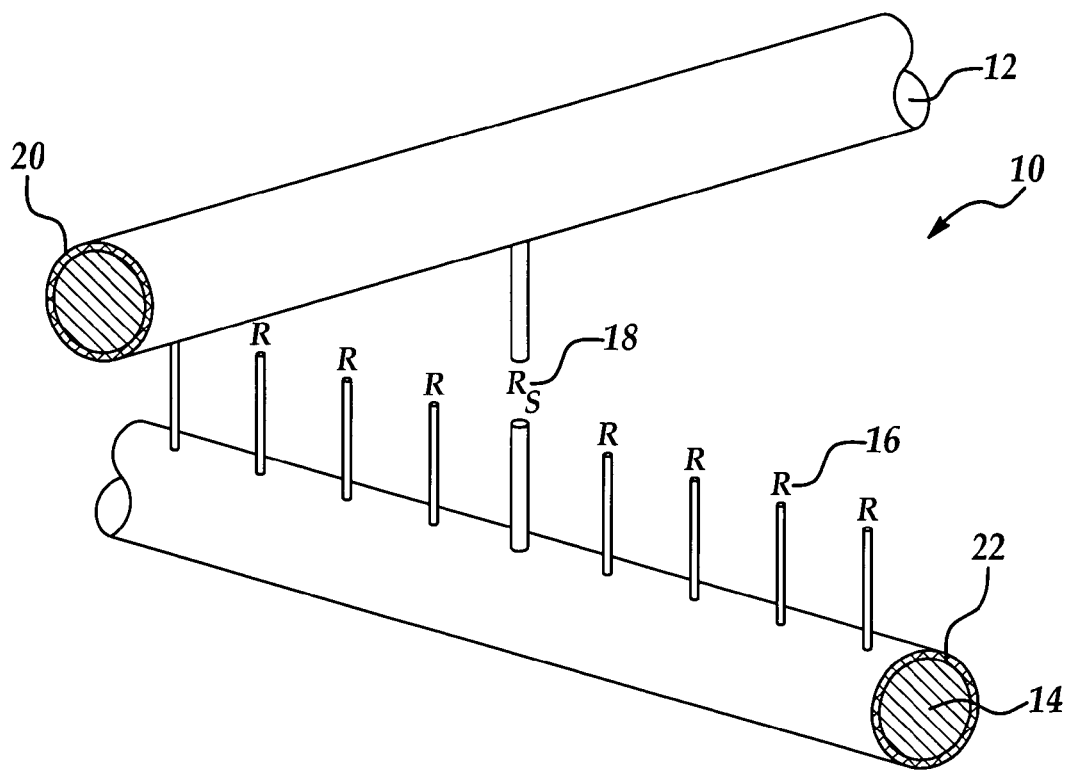

Referring now to FIGS. 1A-1B, a crossed wire switching device 10 includes two wires 12, 14, each either a metal and/or semiconductor wire, that are crossed at some substantially non-zero angle. Disposed between wires 12, 14 is a layer 16 of molecules or molecular compounds, denoted R. The particular molecules 18 that are sandwiched at the intersection (also interchangeably referred to herein as a junction) of the two wires 12, 14 are identified as switch molecules $R_s$.

There are generally two primary methods of operating such switches 10, depending on the nature of the switch molecules 18. The molecular switching layer 16 includes a switch molecule 18 (for example, an organic molecule) that, in the presence of an electrical (E) field, switches between two or more energetic states, such as by an electrochemical oxidation or reduction (redox) reaction or by a change in the band gap of the molecule induced by the applied E-field.

In the former case, when an appropriate voltage is applied across the wires 12, 14, the switch molecules $R_S$ are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) would be oxidized. In another example, a molecule is reduced, and one of the wires 12, 14 is oxidized. In a third example, a molecule is oxidized, and one of the wires 12, 14 is reduced. In a fourth example, one wire 12, 14 is oxidized, and an oxide associated with the other wire 14, 12 is reduced. In such cases, oxidation or reduction may affect the tunneling distance or the tunneling barrier height between the two wires, thereby exponentially altering the rate of charge transport across the wire junction, and serving as the basis for a switch. Examples of molecules 18 that exhibit such redox behavior include rotaxanes, pseudo-rotaxanes, and catenanes; see, e.g., U.S. Pat. No. 6,459,095, entitled "Chemically Synthesized and Assembled Electronic Devices", issued Oct. 1, 2002, to James R. Heath et al, the disclosure of which is incorporated herein by reference in its entirety.

Further, the wires 12, 14 may be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below. Details of such coatings are provided in above-referenced U.S. Pat. No. 6,459,095.

In the latter case, examples of molecule 18 based on field induced changes include E-field induced band gap changes, such as disclosed and claimed in patent application Ser. No. 09/823,195, filed Mar. 29, 2001, published as Publication No. 2002/0176276 on Nov. 28, 2002, which application is incorporated herein by reference in its entirety. Examples of molecules used in the E-field induced band gap change approach include molecules that evidence molecular conformation change or an isomerization; change of extended conjugation via chemical bonding change to change the band gap; or molecular folding or stretching.

Changing of extended conjugation via chemical bonding change to change the band gap may be accomplished in one of the following ways: charge separation or recombination accompanied by increasing or decreasing band localization; or change of extended conjugation via charge separation or recombination and π-bond breaking or formation.

The formation of micrometer scale and nanometer scale crossed wire switches 10 uses either a reduction or oxidation (redox) reaction to form an electrochemical cell or uses E-field induced band gap changes to form molecular switches. In either case, the molecular switches typically have two states, and may be either irreversibly switched from a first state to a second state or reversibly switched from a first state to a second state. In the latter case, there are two possible conditions: either the electric field may be removed after switching into a given state, and the molecule will remain in that state ("latched") until a reverse field is applied to switch the molecule back to its previous state; or removal of the electric field causes the molecule to revert to its previous state, and hence the field must be maintained in order to keep the molecule in the switched state until it is desired to switch the molecule to its previous state.

Color switch molecular analogs, particularly based on E-field induced band gap changes, are also known; see, e.g., U.S. application Ser. No. 09/844,862, filed Apr. 27, 2001.

Figure 2:
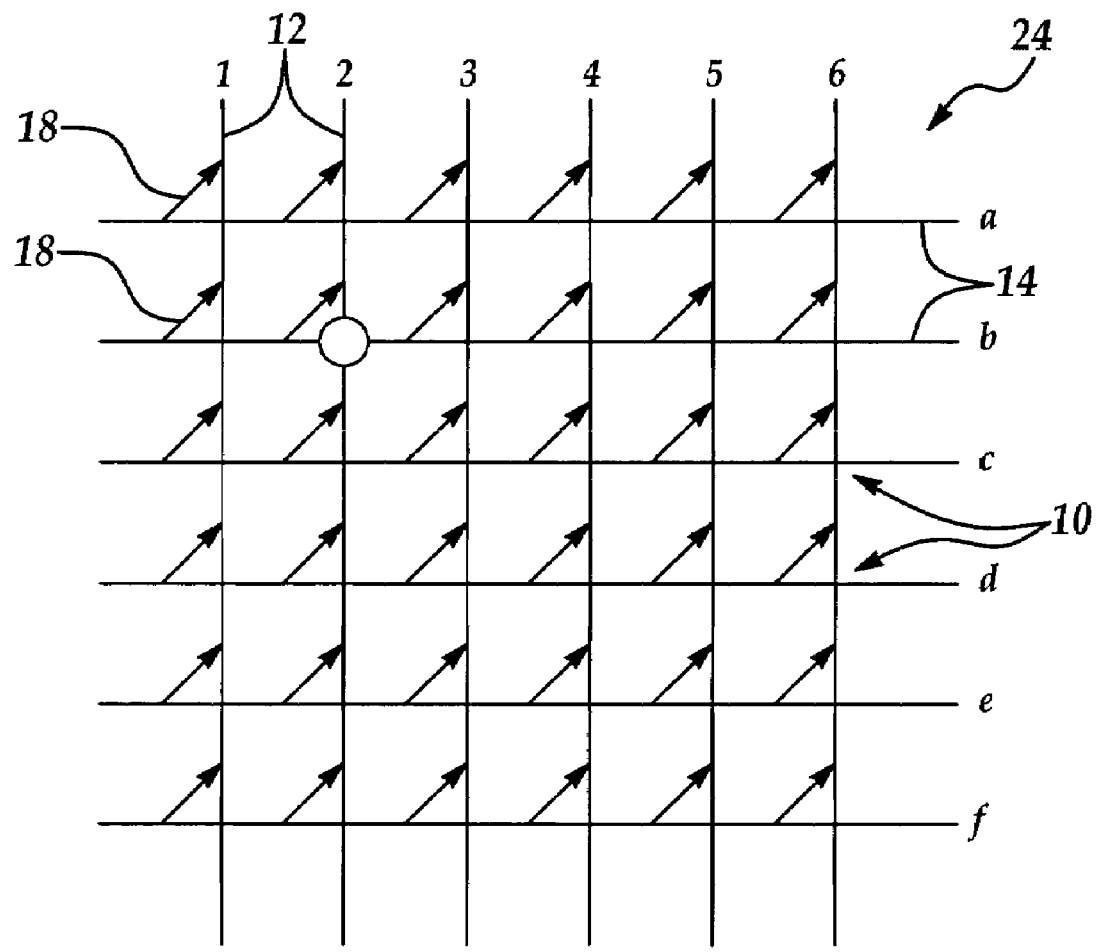
FIG. 2 is a schematic representation of a two-dimensional array of switches, depicting a 6×6 crossbar switch.

Referring now to FIG. 2, the switch 10 may be replicated in a two-dimensional array to form a plurality or array 24 of switches 10 to form a crossbar switch. FIG. 2 depicts a 6×6 array 24. However, it is to be understood that the embodiments herein are not to be limited to the particular number of elements, or switches 10, in the array 24. Access to a single point, e.g., 2b, is done by impressing voltage on wires 2 and b to cause a change in the state of the molecular species 18 at the junction thereof, as described above. Thus, access to each junction is readily available for configuring those that are pre-selected. Details of the operation of the crossbar switch array 24 are further discussed in U.S. Pat. No. 6,128,214, entitled "Molecular Wire Crossbar Memory", issued on Oct. 3, 2000, to Philip J. Kuekes et al., which is incorporated herein by reference in its entirety.

Figure 3:
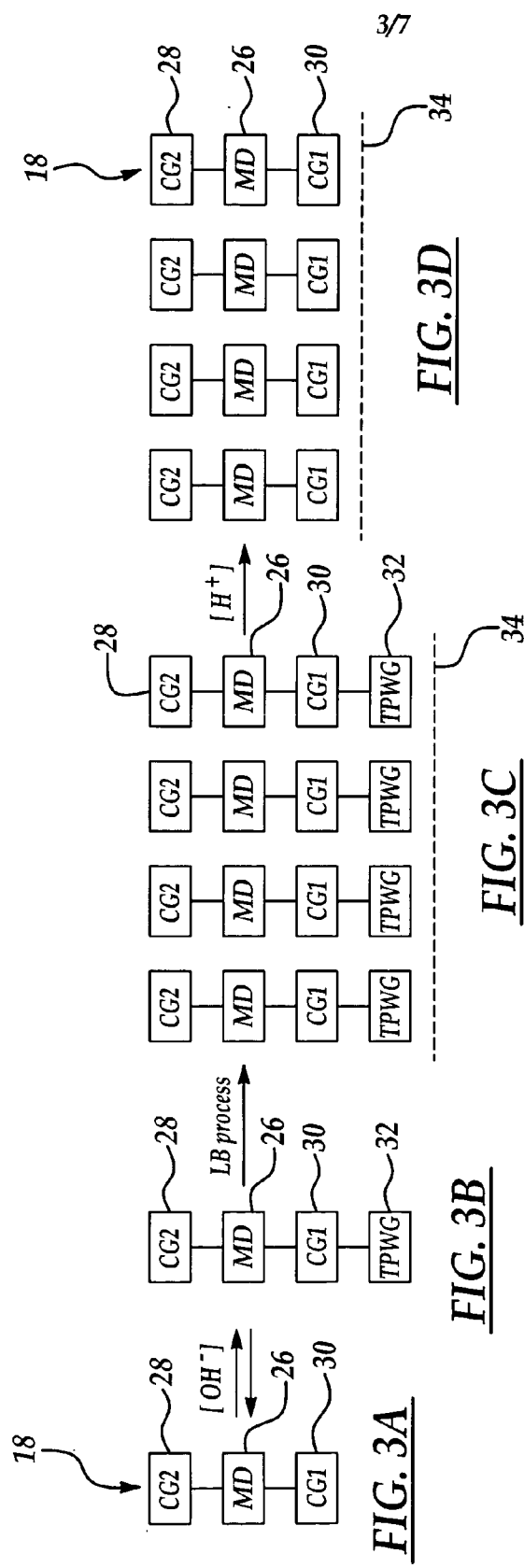
FIGS. 3A-3D is a schematic flow diagram depicting an embodiment of a method of the present invention.

FIG. 3A depicts an embodiment of a molecule suitable to form a molecular layer(s) attachable to a substrate. An aqueous environment contains a molecule 18 with a molecular switching moiety (MD) 26 having a first connecting group (CG1) 30 attached to one end of the moiety 26, and a second connecting group (CG2) 28 attached to an opposed end of the moiety 26.

In an embodiment, the molecule 18 is an organic molecule, and the molecular switching moiety 26 is at least one of an optically switchable molecular functional unit or an electrically switchable molecular functional unit. It is to be understood that the switching moiety 26 may be any suitable moiety, however, in an embodiment, the moiety 26 includes at least one of saturated hydrocarbons, unsaturated hydrocarbons, substituted hydrocarbons, heterocyclic systems, organometallic complex systems, or mixtures thereof.

In an embodiment, the switching moiety 26 is a moiety that, in the presence of an electric field, undergoes oxidation or reduction, and/or experiences a band gap change. In one embodiment, the switching moiety 26 undergoes oxidation or reduction and is at least one of rotaxanes, pseudo-rotaxanes, catenanes, or mixtures thereof. An example of a switching moiety 26 that undergoes a band gap change in the presence of an external electrical field is described in U.S. Pat. No. 6,674,932 granted to Zhang et al. on Jan. 6, 2004, the specification of which is incorporated herein by reference in its entirety.

It is to be understood that one of the first and second connecting groups (CG1, CG2) 30, 28 may be adapted to be a substantially non-protectable group while the other of the second and first connecting groups (CG2, CG1) 28, 30 may be adapted to be a substantially protectable group. In the embodiment depicted in FIG. 3A, the first connecting group (CG1) 30 is a protectable group and the second connecting group (CG2) 28 is a substantially non-protectable group.

Non-limiting examples of suitable substantially non-protectable group(s) include at least one of multivalent hetero atoms selected from the group consisting of C, N, O, S, and P; functional groups containing the hetero atoms and selected from the group consisting of SH, S-alkyl, S-aryl, SS-alkyl, SS-aryl, S-acyl, OH, O-aryl, O-alkyl, O-acyl, $SiCl_3$, $NH_2$, NH-alkyl, NH-aryl, NH-acyl, N-(alkyl)$_2$, N-(aryl)$_2$, N-(alkyl)(aryl), $PH_2$, PH-alkyl, PH-aryl, PH-acyl, P-(alkyl)$_2$, P-(aryl)$_2$, P-(alkyl)(aryl); saturated hydrocarbons; unsaturated hydrocarbons; substituted hydrocarbons; heterocyclic compounds; carboxylic acids; carboxylic esters; amides; nitrites; and mixtures thereof. It is to be understood that this group may advantageously orient the molecule 18 during LB film preparation processing (discussed hereinbelow). Further, the substantially non-protectable group may advantageously remain stable during subsequent thin film preparation processes, and it may advantageously remain resistant to attack during subsequent protection and de-protection processes (discussed hereinbelow).

Non-limiting examples of suitable protectable group(s) include at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitrites; and mixtures thereof.

Referring now to FIG. 3B, as the pH of the aqueous environment is adjusted, a hydrophilic temporary protecting group (TPWG) 32 may be removably attached (e.g. via chemical bonding) to the first connecting group (CG1) 30, wherein the temporary protecting group (TPWG) 32 is more hydrophilic than the first connecting group (CG1) 30 and the second connecting group (CG2) 28. Examples of hydrophilic temporary protecting groups (TPWG) 32 include, but are not limited to photo-labile acids, thermal-labile acids, chemical labile acids, derivatives thereof, and mixtures thereof.

Specific non-limiting examples of photo- and thermo-labile acids include acid substituted benzyloxycarbonyl (BOC) derivatives, acid substituted 3,5-[(dimethoxybenzoinyl)oxy]carbonyl (DMO)-carbamate derivatives, acid substituted 2-nitrobenzyloxycarbonyl (N-BOC) derivatives, acid substituted N-nitroveratryloxycarbonyl (NCOC) derivatives, acid substituted 4-(4',8'-dimethoxylnaphthylmethyl)benzenesulfonamide derivatives, acid substituted 3,4-dimethoxy-6-nitrobenzyl carbamate derivatives, substituted 3,4-dimethoxy-6-nitrobenzyl carbamate derivatives, etc. Specific non-limiting examples of chemical labile acids include $—CO_2^-$, $—SO_3^-$, $—NH_3^+$, $—NHR_2^+$, $—NH_2R^+$, $-PyH^+$, carboxylic acids, carboxylic esters, amides, ketones, nitriles, $—OH$, $—CH=NOH$, and mixtures thereof.

Referring now to FIG. 3C, a Langmuir-Blodgett (LB) film of the molecule 18 is formed on an interface 34 between an organic solvent(s)/air and water, the film being depicted by the plurality of molecules 18 shown. The organic solvent(s) is above the water, and in some instances may volatilize quickly; as such what was an interface 34 between water and organic solvent(s) may become an interface 34 between water and air. Thus, it is to be understood that interface 34 as defined herein may be a water/solvent interface 34 and/or a water/air interface 34. Without being bound to any theory, it is believed that the difference in hydrophilicity between the hydrophilic temporary protecting group (TPWG) 32 and the second connecting group (CG2) 28 causes formation of a substantially well-oriented, uniform LB film at the interface 34 of the organic solvent(s)/air and the water. This may be due in part to the hydrophilic temporary protecting group (TPWG) 32 remaining at the interface 34 and the second connecting group (CG2) 28 remaining in the air during LB film processing.

The hydrophilic temporary protecting group (TPWG) 32 may then be removed from the first connecting group (CG1) 30. Removal of the hydrophilic temporary protecting group (TPWG) 32 may be accomplished by a thermal, chemical, photochemical process, or a combination thereof. For example, if the hydrophilic temporary protecting group (TPWG) 32 is a photo-labile group, it may be exposed to a certain wavelength of UV light for removal; if it 32 is a chemical-labile group, it may be treated with a certain chemical(s) (e.g. acid or base) for removal; or if it 32 is a thermal-labile group, it may be exposed to suitable heat for removal. After hydrophilic temporary protecting group 32 is removed, the un-capped LB film remains, thus having a reactive first connecting group (CG1) 30 and a substantially intact second connecting group (CG2) 28. It is to be understood that by-product(s) of the removal process may be at least one of water-soluble or substantially easily separable from the LB film.

If the hydrophilic temporary protecting group 32 is a photo-labile group, the specific wavelength to which it is exposed for removal typically depends on the photo-labile group 32, but is that wavelength sufficient to cleave the group 32 from the first connecting group 30. The removed photo-labile group 32 dissolves in the aqueous environment.

The substrate is then passed through the Langmuir-Blodgett film to form the molecular layer chemically bonded on the substrate (not shown in FIGS. 3A-3D).

Embodiments as disclosed herein are advantageously suitable for fabricating molecular devices with molecules containing two or more substantially asymmetric, connecting groups 28, 30. In an embodiment, it is desirable that both of the connecting groups 28, 30 be capable of forming good electrical contact with substrates 38, 40 (as shown in FIGS. 4(VII) and 4(IX')) made of noble metals (e.g. Au, Pt, Ag, Cu, alloys of these metals, or the like) via chemical bonding.

Figure 4:
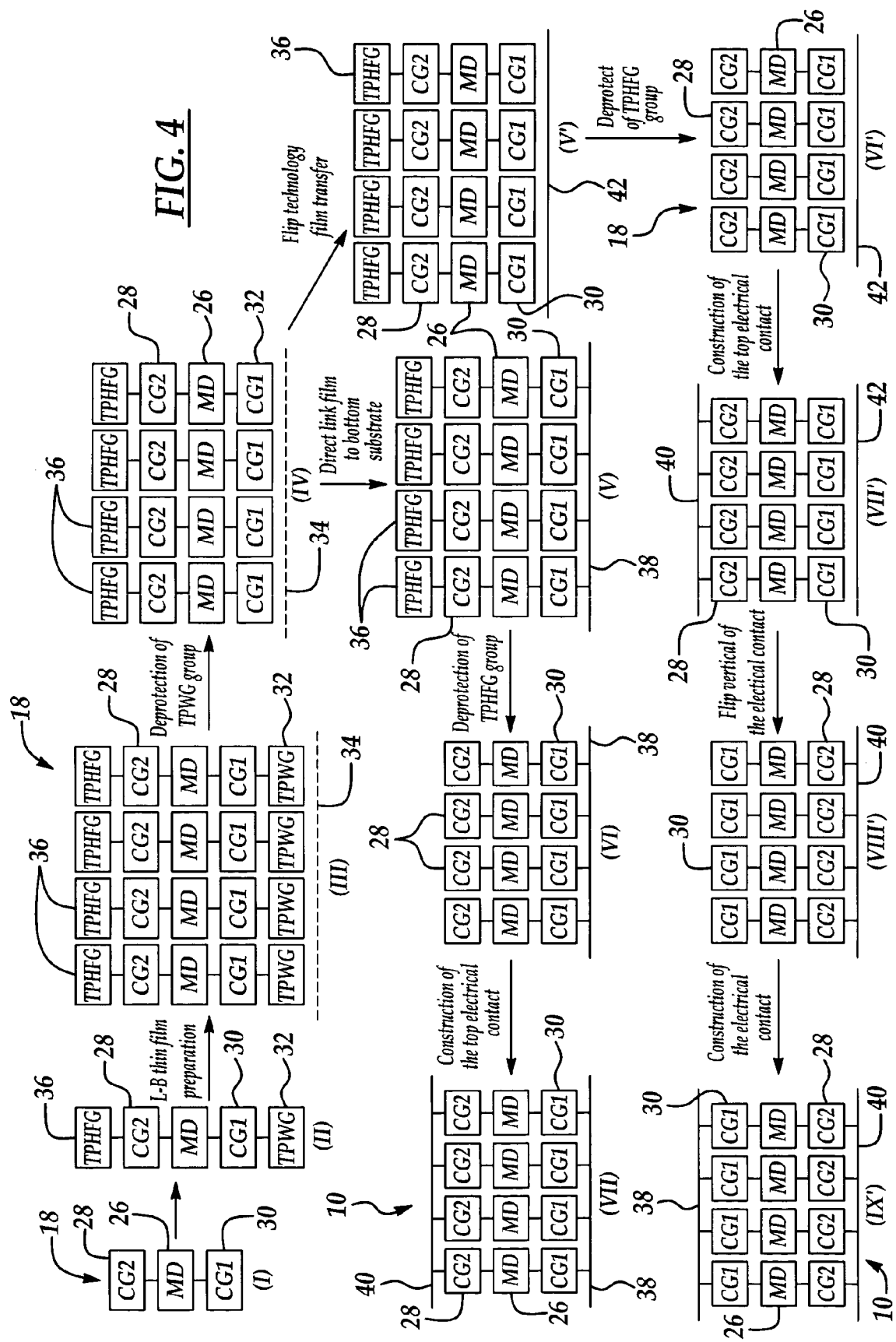
FIG. 4 is similar to FIG. 3, but depicts an alternate embodiment of a method of the present invention.

In an embodiment, one of the first connecting group (CG1) 30 or the second connecting group (CG2) 28 is a connecting unit between the organic molecule 18 and the substrate (38, 40 as shown in FIGS. 4(VII) and 4(IX')). The other of the second connecting group (CG2) 28 or the first connecting group (CG1) 30 is a connecting unit between the organic molecule 18 and an other substrate (38, 40 as shown in FIGS. 4(VII) and 4(IX')). It is to be understood that the substrate 38 and the other substrate 40 is a solid substrate, and may be either an electrode or a non-electrode, depending on the application. It is to be further understood that the substrate 38 and the other substrate 40 may each be hydrophilic, hydrophobic, or one may be hydrophilic and the other may be hydrophobic. As such, first connecting group 30 or second connecting group 28 will be more attracted to the substrate 38 or the other substrate 40, depending upon the hydrophilicity or hydrophobicity of the substrate 38 or other substrate 40 and of the connecting group 30, 28. The substrates will be discussed in further detail below in relation to FIGS. 4 through 6.

Referring now to the flow diagram of FIG. 4, either one (CG1, CG2) 30, 28 or both of the first and second connecting groups (CG1, CG2) 30, 28 of the molecule 18 may be adapted to be protectable groups. The first and second connecting groups (CG1, CG2) 30, 28 may be the same, similar or different protectable groups. In this embodiment, the protectable groups include, but are not limited to at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitrites; and mixtures thereof.

In the embodiment as depicted in FIG. 4(II), each connecting group (CGI, CG2) 28, 30 is a protectable group that is adapted to have a hydrophilic temporary protecting group (TPWG) 32 or a hydrophobic temporary protecting group (TPHFG) 36 attached thereto. It is to be understood that one of the first and second connecting groups (CG1, CG2) 30, 28 may have a hydrophilic temporary protecting group (TPWG) 32 attached thereto and the other of the second and first connecting groups (CG2, CG1) 28, 30 may have a hydrophobic temporary protecting group (TPHFG) 36 attached thereto. As a non-limitative example, FIG. 4(11) depicts the first connecting group (CG1) 30 having a hydrophilic temporary protecting group (TPWG) 32 and the second connecting group (CG2) 28 having a hydrophobic temporary protecting group (TPHFG) 36.

Non-limitative examples of suitable hydrophilic temporary protecting groups (TPWG) 32 include those previously described in reference to FIG. 3B. Non-limitative examples of suitable hydrophobic temporary protecting groups (TPHFG) 36 include at least one of photo-labile acids having linear long end chains, thermal-labile acids having linear long end chains, chemical labile acids having linear long end chains, derivatives thereof, or mixtures thereof. Specific non-limitative examples of photo- and thermo-labile acids include acid substituted benzyloxycarbonyl (BOC) derivatives, acid substituted 3,5-[(dimethoxybenzoinyl)oxy]carbonyl (DMO)-carbamate derivatives, acid substituted 2-nitrobenzyloxycarbonyl (N-BOC) derivatives, acid substituted N-nitroveratryloxycarbonyl (NCOC) derivatives, acid substituted 4-(4',8'-dimethoxylnaphthylmethyl)benzenesulfonamide derivatives, acid substituted 3,4-dimethoxy-6-nitrobenzyl carbamate derivatives, substituted 3,4-dimethoxy-6-nitrobenzyl carbamate derivatives, and the like, and mixtures thereof; each of the acids listed immediately above having linear long end chains attached thereto. Specific non-limitative examples of chemical labile acids include $—CO_2^-$, $—SO_3^-$, $—NH_3^+$, $—NHR_2^+$, $—NH_2R^+$, $-PyH^+$, carboxylic acids, carboxylic esters, amides, ketones, nitriles, —OH, —CH=NOH, and the like, and mixtures thereof; each of the acids listed immediately above having linear long end chains attached thereto. In an embodiment, the linear long end chains include, but are not limited to at least one of ester groups, ether groups, silyl ether groups, carbo-amide groups, or mixtures thereof.

Referring now to 4(III), an LB film is formed on an interface 34 between an organic solvent(s)/air and water, the film being depicted by the plurality of molecules 18 (having a hydrophilic end and a hydrophobic end). During preparing the LB film, it is believed that this difference in hydrophilicity causes the molecule(s) 18 to orient itself such that the hydrophilic temporary protecting group (TPWG) 32 preferentially resides at the solvent/water or solvent/air interface 34 of the LB trough and the hydrophobic temporary protecting group (TPHFG) 36 preferentially resides in air. The difference in hydrophilicity provided by the temporary protecting groups (TPWG, TPHFG) 32, 36 may also advantageously cause formation of a substantially well-oriented, uniform LB film.

It is to be understood that any solvent suitable for an LB process may be used. In an embodiment, the solvent is water, organic solvents, or mixtures thereof. Suitable organic solvents include, but are not limited to chloroform, dichloromethane, benzene, toluene, ethyl acetate, hexane, pentane, heptane, ethyl ether, or the like.

FIG. 4(IV) depicts the removal of the hydrophilic temporary protecting group (TPGW) 32 from the LB film. As previously discussed, removal may be accomplished by a thermal, chemical, or photochemical process, or a combination thereof. For example, the LB film may be exposed to a particular wavelength of UV light; treated with a chemical; or exposed to mild heating (one non-limitative example of a suitable heating temperature ranges between about 50° C. and about 250° C.). It is to be understood that these processes may selectively decompose the hydrophilic temporary protecting group (TPGW) 32 to form the LB film having a reactive first connecting group (CG1) 30 and a substantially intact (having been resistant to attack during removal of the hydrophilic temporary protecting group 32) hydrophobic temporary protecting group (TPHFG) 36.

In any of the embodiments described herein, there are at least two non-limitative embodiments for constructing crossbar devices 10 with good electrical contact. A first embodiment, direct linking to an electrode substrate 38, may be desirable if the first connecting group (CG1) 30 is reactive enough to form a chemical bond quickly with the bottom substrate or electrode 38 (it is to be understood that an annealing at a mild elevated temperature (one non-limitative example of a suitable annealing temperature ranges between about 50° C. and about 250° C.) under an inert environment (non-limitative examples of suitable inert environments include $N_2$ or Argon atmospheres) may be advantageous in order to facilitate the solid-solid interaction).

In this first embodiment, the LB thin film (FIG. 4(IV)) is transferred and chemically bonded onto the bottom electrode 38 to form a semi-device (FIG. 4(V)). At this time, the hydrophobic temporary protecting group (TPHFG) 36 may be selectively removed by a thermal, chemical or photochemical process, or a combination thereof. It is to be understood that by-product(s) of this process may be volatile under a vacuum condition and thus may be substantially easily removed from the LB film. In an embodiment, the removal is accomplished with hydrofluoric acid (HF), followed by vacuum evaporation of volatile by-products to render a complete non-protected semi-device (FIG. 4(VI)). A chemically bonded top metal substrate or electrode 40 may then be formed by any suitable process, for example, a sputtering process, a thermal vapor deposition, or an evaporative metal deposition process, to yield the desired crossbar device 10 (FIG. 4(VII)).

A second non-limitative embodiment for constructing crossbar devices 10 with good electrical contact may be desirable if the first connecting group 30 is not reactive enough toward the electrode substrate 38 in the bonding reaction among the solid-solid interface. In this second embodiment, the LB thin film (FIG. 4(IV)) is transferred onto a non-electrode solid substrate 42 to form a temporary intermediate device (FIG. 4(V')). At this time, the hydrophobic temporary protecting group (TPHFG) 36 may be selectively removed by a thermal, chemical or photochemical process, or a combination thereof. It is to be understood that any by-products of this process may be volatile under a vacuum condition and thus may be substantially easily removed from the LB film. In an embodiment, the removal is accomplished by a treatment with hydrofluoric acid (HF), followed by vacuum evaporation of volatile by-products to render an uncapped molecule 18 (FIG. 4(VI')). A chemically bonded top metal electrode 40 is then formed by any suitable process, such as for example, thermal vapor deposition or an evaporative metal deposition process to yield a semi-device (FIG. 4(VII')). The device is then flipped vertically about the electrical contact to yield the device as shown in FIG. 4(VIII'). Non-electrode solid substrate 42 is removed, and a bottom electrode 38 is then formed by any suitable process, such as, for example, a thermal vapor deposition process, an evaporative metal deposition process, a sputtering process, or the like to finish the final desired crossbar device 10 (FIG. 4(IX')).

It is to be understood that non-electrode solid substrate 42 may be formed from any suitable material, including but not limited to at least one of inorganic materials (e.g. glass, silicon, metal oxides (e.g. silicon oxides, aluminum oxides, etc.) and the like), organic materials (e.g. polycarbonates and the like), or combinations thereof.

Figure 5A:
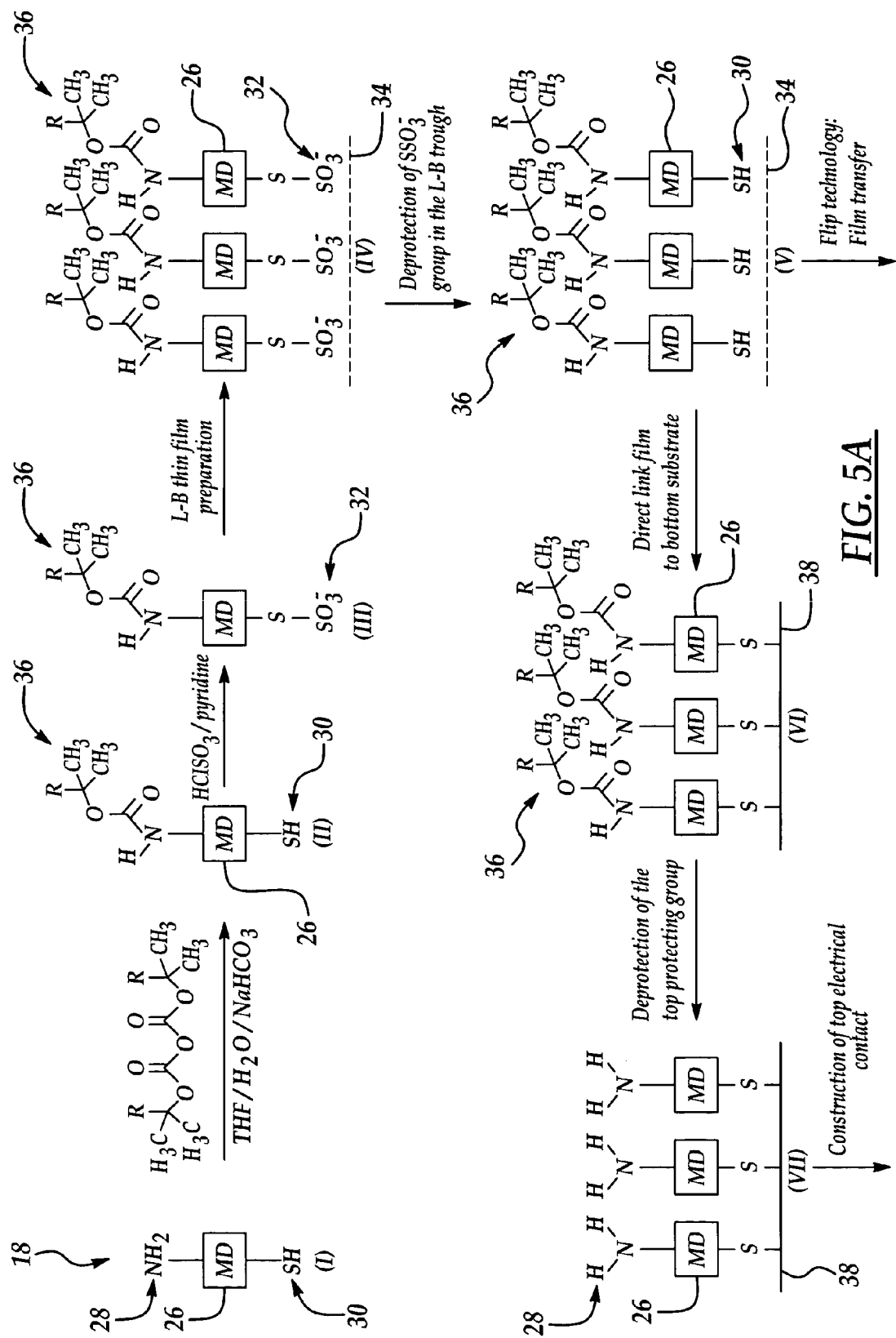
Figure 5B:
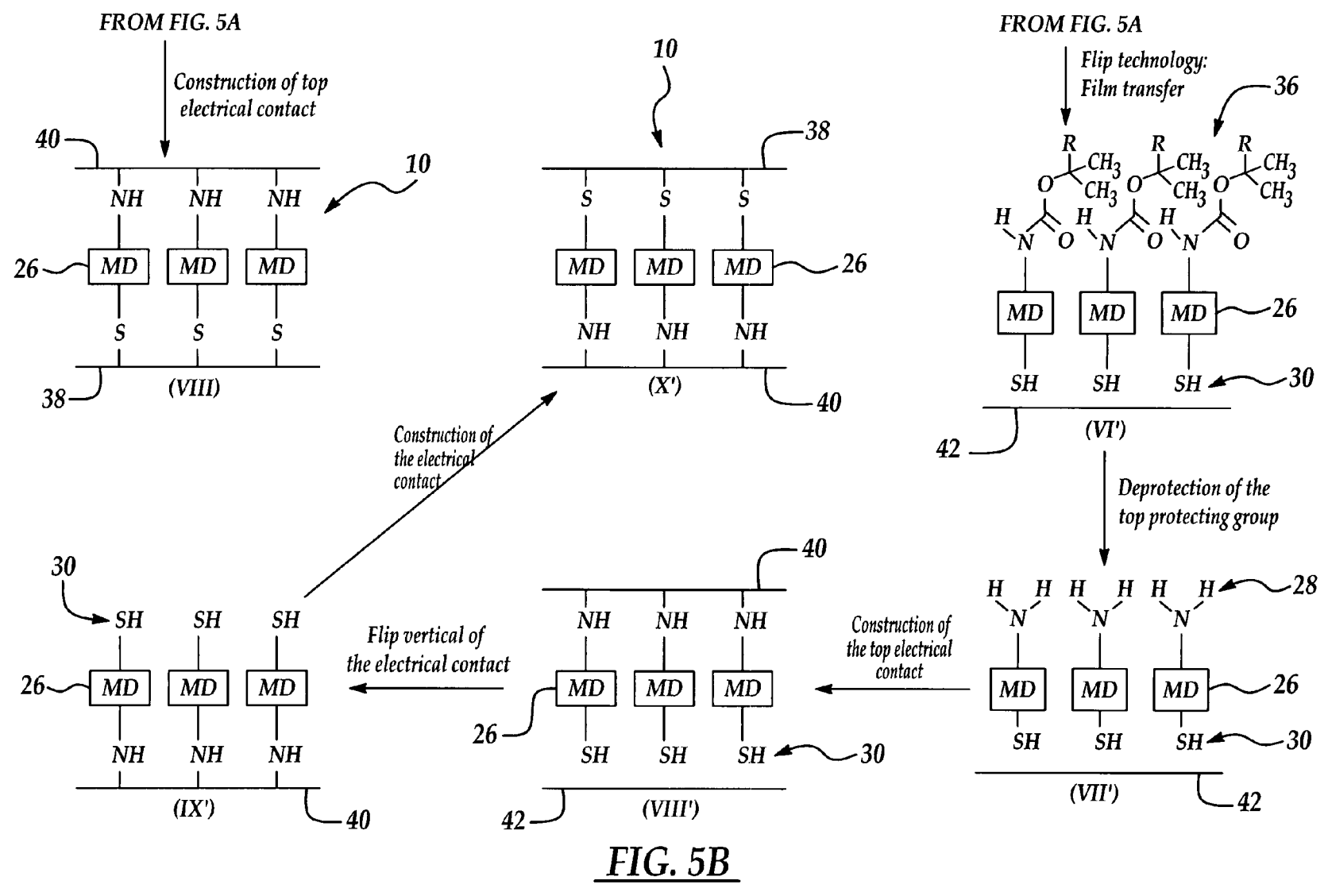

A non-limitative embodiment of the method is shown in the flow diagram of FIGS. 5A and 5B. In this embodiment, the molecule 18 has SH as the first connecting group (CG1) 30 and $NH_2$ as the second connecting group (CG2) 28. It is to be understood that both of these connecting group materials may be reactive toward noble metals (e.g. Au, Cu, Ag, Pt, etc), and thus may form good chemical bonding with an electrode material.

FIGS. 5(I) and 5(II) illustrate the attachment of a hydrophobic temporary protecting group (TPHFG) 36 (—NHCOOC$(CH_3)_2$R) to form a mono-capped molecule (FIG. 5(II)). This may be accomplished by treating the $NH_2$ second connecting group 28 with alkyl di-carboxylate under a mild base condition. It is to be understood that this group may remain stable during the preparation of —S—$SO_3^-$ anion (FIG. 5(III), the LB thin film preparation process (FIG. 5(IV)), and the de-protection of the SH first connecting group 30 (FIG. 5(V)) via UV irradiation or base immersion to a pH>10.

It is to be understood that the R in the hydrophobic temporary protecting group 36 may be any suitable alkyl group including, but not limited to —$CH_3$, —$C_2H_5$, —$C_3H_7$, —$C_4H_9$, —$C_5H_{11}$, —$C_6H_{13}$, —$C_7H_{15}$, —$C_8H_{17}$, —$C_9H_{19}$, —$C_{10}H_{21}$, —$C_{11}H_{23}$, substituted hydrocarbons (e.g. —$(CH_2)_n$—Ar; —$(CH_2)_n$-Het; where n>0, the —Ar may be any suitable aromatic hydrocarbon, and the Het may be any suitable heterocyclic system; or the like), or combinations thereof.

Referring now to FIG. 5(III), an —S—$SO_3^-$ anion (the water-soluble anionic form of sulfuric acid thio ester) hydrophilic temporary protecting group 32 is attached to the SH first connecting group 30 by reacting —SH and $Na_2SO_3/O_2$ at pH 7-8.5 in the presence of a trace amount of a cysteine catalyst. It is to be understood that the —S—$SO_3^-$ anion may advantageously stay in the interface 34 of organic solvent(s)/water and/or water/air during the Langmuir-Blodgett thin film preparation. It is to be understood that the hydrophilic temporary protecting group 32 will also remain substantially stable during thin film preparation (FIG. 5(IV)).

The formation of the LB film in a trough is illustrated in FIG. 5(IV). The thin LB film has its —$SO_3^-$ anion group(s) 32 in the organic solvent/water and/or water/air interface 34 and the —NHCOOC$(CH_3)_2$R group(s) 36 in the air. It is believed that this may be due, at least in part, to the difference in hydrophilicity of the opposed ends of molecule(s) 18.

FIG. 5(V) illustrates the removal of the —S—$SO_3^-$ anion hydrophilic temporary protecting group 32. Removal may be accomplished by adjusting the pH of the water phase to basic (>10) with an NaOH solution once the thin film is formed or by exposing the thin film to UV irradiation. It is to be understood that the by-product(s) of removal of the hydrophilic temporary group 32 may be water-soluble and easily separated from the thin film.

As discussed hereinabove, there are at least two non-limitative embodiments for constructing crossbar devices 10 with good electrical contact. In the first embodiment, the LB thin film (FIG. 5(V)) is transferred and chemically bonded onto the bottom electrode 38 to form a semi-device (FIG. 5(VI)). The LB film is treated with vaporized or gas formed acid (e.g. trifluoro-acetic acid, HF, HBr, HCl, HI etc.) to remove the —NHCOOC$(CH_3)_2$R hydrophilic temporary protecting group(s) 36, followed by a vacuum evaporation of volatile by-products to form the complete un-protected thin film device (FIG. 5(VII)). A chemically bonded top metal substrate or electrode 40 may then be formed by any suitable process, such as for example, a sputtering process, a thermal vapor deposition or an evaporative metal deposition process, to yield the desired crossbar device 10 (FIG. 5(VIII)).

In the second embodiment, the LB thin film (FIG. 5(V)) is transferred onto a non-electrode solid substrate 42 to form a temporary intermediate device (FIG. 5(VI')). The —NHCOOC$(CH_3)_2$R hydrophobic temporary protecting group 36 may be removed to form the uncapped film (FIG. 5(VII')). A chemically bonded top metal electrode 40 is formed by, for example, a thermal vapor deposition or an evaporative metal deposition process to yield a semi-device (FIG. 5(VIII')). The device is then flipped vertically about the electrical contact to yield the device as shown in FIG. 5(IX'). Non-electrode solid substrate 42 is removed, and a bottom electrode 38 is then formed by a thermal vapor deposition process, an evaporative metal deposition process, a sputtering process, or the like to finish the final desired crossbar device 10 (FIG. 5(X')).

Figure 6:
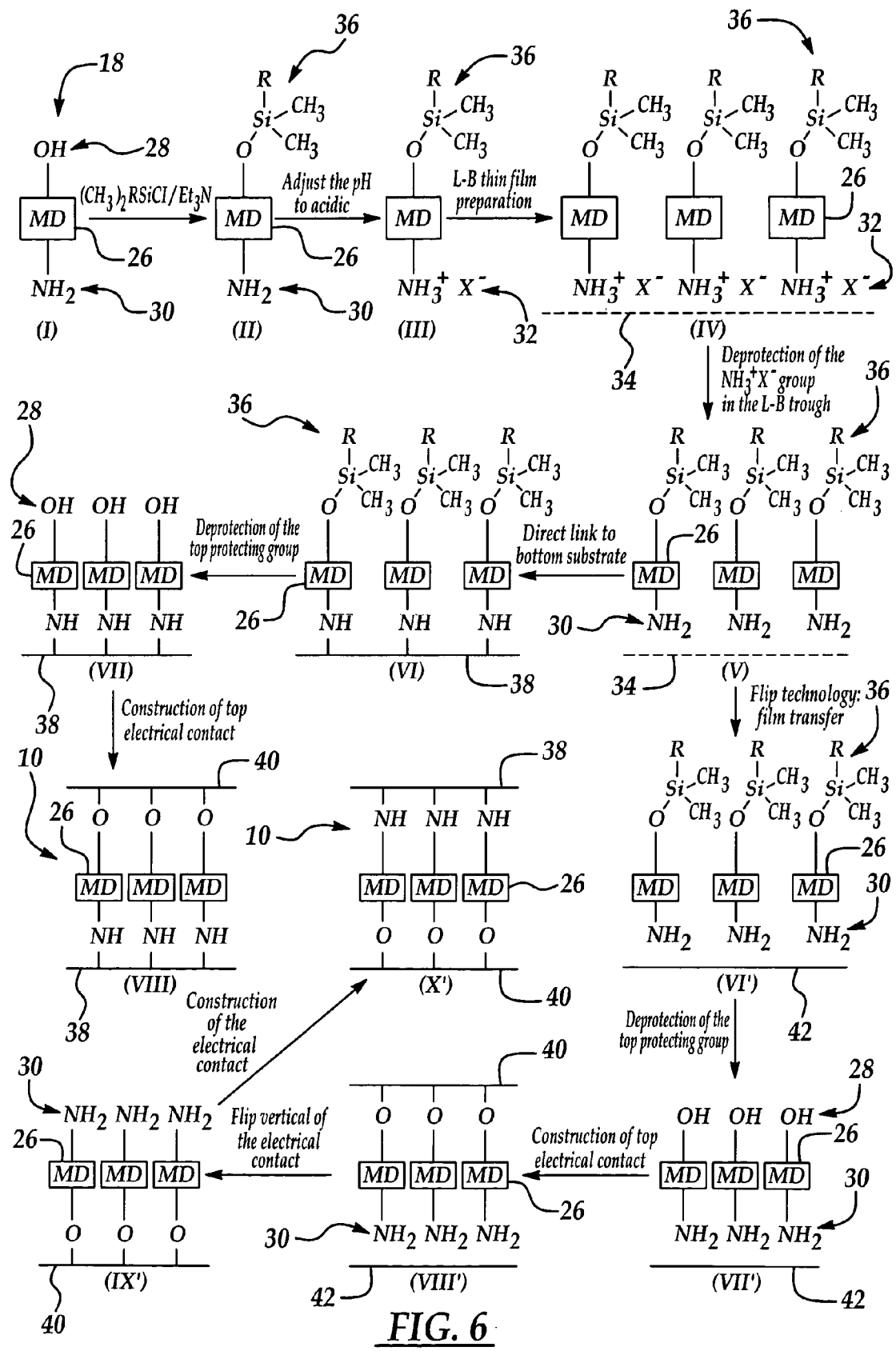
FIG. 6 is similar to FIG. 3, but depicts still a further alternate embodiment of a method of the present invention.

A further non-limitative embodiment of the method is shown in the flow diagram of FIG. 6. In this embodiment, the molecule 18 has $NH_2$ as the first connecting group (CG1) 30 and OH as the second connecting group (CG2) 28. It is to be understood that both of these connecting group materials may be reactive toward noble metals (e.g. Au, Cu, Ag, Pt, etc), and thus may form good chemical bonding with an electrode material.

FIGS. 6(I) and 6(II) illustrate the attachment of a hydrophobic temporary protecting group (TPHFG) 36 (—OSi$(CH_3)_2$R) to form a mono-capped molecule (FIG. 6(II)). This may be accomplished by treating —OH with $(CH_3)_2$RSiCl under a mild base condition. It is to be understood that this group may remain stable during the preparation of the —$NH_3^+X^-$ group (FIG. 6(III)), the LB thin film preparation process (FIG. 6(IV)), and the de-protection of the $NH_2$ first connecting group 30 (FIG. 6(V)).

The —OSi(CH3)$_2$R group is an example of a trialkyl silyl type of hydrophobic temporary protecting group 36. It is to be understood that the R in the hydrophobic temporary protecting group 36 may be any suitable alkyl group including, but not limited to at least one of —$CH_3$, —$C_2H_5$, —$C_3H_7$, —$C_4H_9$, —$C_5H_{11}$, —$C_6H_{13}$, —$C_7H_{15}$, —$C_8H_{17}$, —$C_9H_{19}$, —$C_{10}H_{21}$, —$C_{11}H_{23}$, substituted hydrocarbons (e.g. —$(CH_2)_n$—Ar; —$(CH_2)_n$-Het; where n>0, the —Ar may be any suitable aromatic hydrocarbon, and the Het may be any suitable heterocyclic system; or the like), or combinations thereof. A generic representation of a trialkyl silyl type of temporary protecting group 36 is —OSiR$_1$R$_2$R$_3$. It is to be understood that the R$_1$, R$_2$, R$_3$ may each be the same type of alkyl group, may each be a different alkyl group, or may be any combination of similar and different alkyl groups. The non-limitative examples of R groups listed above may also serve as suitable non-limitative examples of R$_1$, R$_2$, R$_3$ groups.

FIG. 6(III) illustrates the attachment of a hydrophilic temporary protecting group (TPWG) 32. This may be accomplished by subjecting the —NH$_2$ first connecting group 30 to a pH of about 2-4 to generate an —NH$_3^+$X$^-$ hydrophilic temporary protecting group 32. It is to be understood that the —NH$_3^+$X$^-$ group may advantageously remain stable and may stay in the organic solvent(s)/water and/or water/air interface 34 during the Langmuir-Blodgett thin film preparation.

The formation of the LB film in a trough is illustrated in FIG. 6(IV). The thin LB film has its —NH$_3^+$X$^-$ group(s) 32 in the organic solvent/water and/or water/air interface 34 and the —OSi(CH$_3$)$_2$R group(s) 36 in the air. It is believed that this may be due, at least in part, to the difference in hydrophilicity of the opposed ends of molecule(s) 18.

FIG. 6(V) illustrates the deprotection of first connecting group 30. This is accomplished by transforming —NH$_3^+$X$^-$ hydrophilic temporary protecting group(s) 32 into the —NH$_2$ first connecting group(s) 30. This transformation may be accomplished by adjusting the pH of the water phase to basic (>10) with NaOH solution once the thin film is formed.

As previously discussed, at least two non-limitative embodiments may be used for constructing crossbar devices 10 with good electrical contact. In the first embodiment, the LB thin film (FIG. 6(V)) is transferred and chemically bonded onto the bottom electrode 38 to form a semi-device (FIG. 6(VI)). The LB film is treated with vaporized or gas formed acid (e.g. trifluoro-acetic acid, HF, HBr, HCl, HI, etc.) to remove the —OSi(CH$_3$)$_2$R hydrophobic temporary protecting group(s) 36, followed by a vacuum evaporation of volatile by-products to form the complete un-protected thin film device (FIG. 6(VII)). A chemically bonded top metal substrate or electrode 40 may then be formed by a sputtering process, a thermal vapor deposition or an evaporative metal deposition process to yield the desired crossbar device 10 (FIG. 6(VIII)).

In the second embodiment, the LB thin film (FIG. 6(V)) is transferred onto a non-electrode solid substrate 42 to form a temporary intermediate device (FIG. 6(VI')). The —OSi(CH$_3$)$_2$R hydrophobic temporary protecting group 36 may be removed to form the uncapped film (FIG. 6(VII')). A chemically bonded top metal electrode 40 is formed by a sputtering process, a thermal vapor deposition, or an evaporative metal deposition process to yield a semi-device (FIG. 6(VIII')). The device is then flipped vertically about the electrical contact to yield the device as shown in FIG. 6(IX'). Non-electrode solid substrate 42 is removed, and a bottom electrode 38 is then formed by a thermal vapor deposition process, an evaporative metal deposition process, a sputtering process, or the like to finish the final desired crossbar device 10 (FIG. 6(X')).

An embodiment of a crossed wire molecular device 10 includes at least one bottom electrode(s) 38, at least one top electrode(s) 40 crossing the bottom electrode(s) 38 at a non-zero angle, and a molecular layer formed from at least one molecule(s) 18 having at least one molecular switching moiety 26 with first and second connecting groups (CG1, CG2) 30, 28 at opposed ends of the moiety 26. The molecular layer is operatively disposed in at least one junction formed where one electrode 38, 40 crosses another electrode 40, 38.

A non-limitative embodiment of a method of forming the crossed wire molecular device 10 is as follows. At least one temporary protecting group 32, 36 is attached to at least one of the first and second connecting groups (CG1, CG2) 30, 28 of the molecule 18. The temporary protecting group(s) may cause a difference in hydrophilicity such that one of the ends of the molecule 18 remains in a water/solvent interface 34 and/or a water/air interface 34, and the other end of the molecule 18 remains in the air during formation of a Langmuir-Blodgett (LB) film. An LB film of the molecule 18 is formed on the interface 34. The temporary protecting group(s) 32, 36 are removed. Each of the bottom electrodes 38 is passed through the Langmuir-Blodgett film to form the molecular layer chemically bonded, via the first or second connecting group (CG1, CG2) 30, 28 on a surface of the bottom electrode 38. The method may further include forming one of the top electrodes 40, crossing the one of the bottom electrodes 38 at the non-zero angle, thereby forming the junction therebetween. The molecular layer is thereby chemically bonded, via the other of the second and first connecting group (CG2, CG1) 28, 30, on a surface of the top electrode 40.

While several embodiments have been described in detail, it will be apparent to those skilled in the art that the disclosed embodiments may be modified. Therefore, the foregoing description is to be considered exemplary rather than limiting.

What is claimed is:

1. A method of attaching a molecular layer to a substrate, the method comprising:

attaching at least one temporary protecting group to a molecule having a molecular switching moiety, the switching moiety having first and second connecting groups attached to opposed ends of the moiety, the at least one temporary protecting group attached to at least one of the first and second connecting groups so as to cause the opposed ends of the switching moiety to exhibit a difference in hydrophilicity such that one of the ends remains at at least one of a water/solvent interface and a water/air interface, and the other end remains in air during a Langmuir-Blodgett (LB) process;

forming an LB film of the molecule on the at least one of a water/solvent interface and a water/air interface;

removing the at least one temporary protecting group; and passing the substrate through the Langmuir-Blodgett film to form the molecular layer chemically bonded on the substrate;

wherein the difference in hydrophilicity between the opposed ends of the switching moiety causes formation of a substantially well-oriented, uniform LB film at the at least one of the water/solvent interface and the water/air interface.

2. The method as defined in claim 1 wherein the solvent is at least one of water, organic solvents, and mixtures thereof.

3. The method as defined in claim 1 wherein the molecule is an organic molecule and wherein the molecular switching moiety is at least one of an optically switchable molecular functional unit and an electrically switchable molecular functional unit.

4. The method as defined in claim 3 wherein the molecular switching moiety comprises saturated hydrocarbons, unsaturated hydrocarbons, substituted hydrocarbons, heterocyclic systems, organometallic complex systems, and mixtures thereof.

5. The method as defined in claim 3 wherein the switching moiety comprises at least one of a moiety that, in the presence of an electric field, undergoes oxidation/reduction; and a moiety that, in the presence of an electric field, experiences a band gap change.

6. The method as defined in claim 5 wherein the switching moiety undergoes oxidation/reduction and comprises at least one of rotaxanes, pseudo-rotaxanes, catenanes, and mixtures thereof.

7. The method as defined in claim 5 wherein the switching moiety experiences a band gap change of a type comprising:
   at least one of molecular conformation change and an isomerization;
   change of extended conjugation via chemical bonding change to change the band gap;
   at least one of molecular folding and stretching; and combinations thereof.

8. The method as defined in claim 7 wherein the changing of extended conjugation via chemical bonding change to change the band gap is accomplished by at least one of:
   charge separation or recombination accompanied by increasing or decreasing band localization; and
   change of extended conjugation via charge separation or recombination and u-bond breaking or formation.

9. The method as defined in claim 3 wherein one of the first connecting group and the second connecting group is a connecting unit between the organic molecule and the substrate, and wherein the other of the second connecting group and the first connecting group is a connecting unit between the organic molecule and an other substrate.

10. The method as defined in claim 9 wherein at least one of the substrate and the other substrate comprises an electrode of a crossed-wire device.

11. The method as defined in claim 10 wherein the electrode comprises at least one of a bottom electrode and a top electrode.

12. The method as defined in claim 10 wherein the substrate is a bottom electrode and wherein the other substrate is a top electrode.

13. The method as defined in claim 1 wherein one of the first connecting group and the second connecting group is adapted to be a substantially non-protectable group comprising at least one of multivalent hetero atoms selected from the group consisting of C, N, O, S, and P; functional groups containing the hetero atoms and selected from the group consisting of SH, S-alkyl, S-aryl, SS-alkyl, SS-aryl, S-acyl, OH, O-aryl, O-alkyl, O-acyl, $SiCl_3$, $NH_2$, NH-alkyl, NH-aryl, NH-acyl, N-(alkyl)$_2$, N-(aryl)$_2$, N-(alkyl)(aryl), $PH_2$, PH-alkyl, PH-aryl, PH-acyl, P-(alkyl)$_2$, P-(aryl)$_2$, P-(alkyl)(aryl); saturated hydrocarbons; unsaturated hydrocarbons; substituted hydrocarbons; heterocyclic compounds; carboxylic acids; carboxylic esters; amides; nitriles; and mixtures thereof.

14. The method as defined in claim 13 wherein the other of the second connecting group and the first connecting group is adapted to be a protectable group comprising at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitriles; and mixtures thereof;
   wherein the at least one temporary protecting group is removably attached to the protectable group.

15. The method as defined in claim 14 wherein the at least one temporary protecting group is removed by at least one of thermal, chemical, and photochemical means.

16. The method as defined in claim 1 wherein each of the first connecting group and the second connecting group is adapted to be a protectable group comprising at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitriles; and mixtures thereof;
   wherein the at least one temporary protecting group is removably attached to each protectable group.

17. The method as defined in claim 16 wherein the first connecting group temporary protecting group is a hydrophilic group.

18. The method as defined in claim 17 wherein the hydrophilic group comprises at least one of photo-labile acids, thermal-labile acids, chemical labile acids, derivatives thereof, and mixtures thereof.

19. The method as defined in claim 18 wherein at least one of the at least one of the photo-labile acids and thermal-labile acids comprises at least one of acid substituted benzyloxycarbonyl (BOC) derivatives, acid substituted 3,5-[(dimethoxybenzoinyl)oxy]carbonyl (DMO)-carbamate derivatives, acid substituted 2-nitrobenzyloxycarbonyl (N-BOC) derivatives, acid substituted N-nitroveratryloxycarbonyl (NCOC) derivatives, acid substituted 4-(4', 8'-dimethoxylnaphthylmethyl)benzenesulfonamide derivatives, acid substituted 3,4-dimethoxy-6-nitrobenzyl carbamate derivatives, substituted 3,4-dimethoxy-6-nitrobenzyl carbamate derivatives, and mixtures thereof.

20. The method as defined in claim 18 wherein the chemical labile acids comprise at least one of $-CO_2^-$, $-SO_3^-$, $-NH_3^+$, $-NHR_2^+$, $-NH_2R^+$, $-PyH^+$, carboxylic acids, carboxylic esters, amides, ketones, nitriles, $-OH$, $-CH=NOH$, and mixtures thereof.

21. The method as defined in claim 16 wherein the second connecting group temporary protecting group is a hydrophobic group.

22. The method as defined in claim 21 wherein the hydrophobic group comprises at least one of photo-labile acids having linear long end chains, thermal-labile acids having linear long end chains, chemical labile acids having linear long end chains, derivatives thereof, and mixtures thereof.

23. The method as defined in claim 22 wherein the linear long end chains comprise at least one of ester groups, ether groups, silyl ether groups, carbo-amide groups, and mixtures thereof.

24. A method of forming a crossed wire molecular device comprising a plurality of bottom electrodes, a plurality of top electrodes crossing the bottom electrodes at a non-zero angle, and a molecular layer comprising an organic molecule having at least one molecular switching moiety, the molecular layer operatively disposed in at least one junction formed where one electrode crosses another electrode, the method comprising:
   attaching at least one temporary protecting group to the molecule, the molecular switching moiety having first and second connecting groups attached to opposed ends of the moiety, the at least one temporary protecting group attached to at least one of the first and second connecting groups so as to cause the opposed ends of the switching moiety to exhibit a difference in hydrophilicity such that one of the ends remains at at least one of a water/solvent interface and a water/air interface, and the other end remains in air during a Langmuir-Blodgett (LB) process;

forming an LB film of the molecule on the at least one of a water/solvent interface and a water/air interface;

removing the at least one temporary protecting group;

passing one of the plurality of bottom electrodes through the Langmuir-Blodgett film to form the molecular layer chemically bonded, via one of the first connecting group and the second connecting group, on a surface of the one of the plurality of bottom electrodes; and forming one of the plurality of top electrodes, crossing the one of the plurality of bottom electrodes at the non-zero angle, thereby forming the at least one junction therebetween, wherein the molecular layer is chemically bonded, via the other of the second connecting group and the first connecting group, on a surface of the one of the plurality of top electrodes;

wherein the difference in hydrophilicity between the opposed ends of the switching moiety causes formation of a substantially well-oriented, uniform LB film at the at least one of the water/solvent interface and the water/air interface.

25. The method as defined in claim 24 wherein the at least one temporary protecting group orients the molecule such that the at least one temporary protecting group preferentially resides at the at least one of the water/solvent interface and the water/air interface during the LB film formation.

26. The method as defined in claim 24 wherein the solvent is at least one of water, organic solvents, and mixtures thereof.

27. The method as defined in claim 24 wherein the molecular switching moiety is at least one of an optically switchable molecular functional unit and an electrically switchable molecular functional unit.

28. The method as defined in claim 27 wherein the molecular switching moiety comprises saturated hydrocarbons, unsaturated hydrocarbons, substituted hydrocarbons, heterocyclic systems, organometallic complex systems, and mixtures thereof.

29. The method as defined in claim 24 wherein the switching moiety comprises at least one of a moiety that, in the presence of an electric field, undergoes oxidation/reduction; and a moiety that, in the presence of an electric field, experiences a band gap change.

30. The method as defined in claim 29 wherein the switching moiety undergoes oxidation/reduction and comprises at least one of rotaxanes, pseudo-rotaxanes, catenanes, and mixtures thereof.

31. The method as defined in claim 29 wherein the switching moiety experiences a band gap change of a type comprising:

at least one of molecular conformation change and an isomerization;

change of extended conjugation via chemical bonding change to change the band gap;

at least one of molecular folding and stretching; and combinations thereof.

32. The method as defined in claim 31 wherein the changing of extended conjugation via chemical bonding change to change the band gap is accomplished by at least one of:

charge separation or recombination accompanied by increasing or decreasing band localization; and change of extended conjugation via charge separation or recombination and π-bond breaking or formation.

33. The method as defined in claim 24 wherein one of the first connecting group and the second connecting group is adapted to be a substantially non-protectable group comprising at least one of multivalent hetero atoms selected from the group consisting of C, N, O, S, and P; functional groups containing the hetero atoms and selected from the group consisting of SH, S-alkyl, S-aryl, SS-alkyl, SS-aryl, S-acyl, OH, O-aryl, O-alkyl, O-acyl, $SiCl_3$, $NH_2$, NH-alkyl, NH-aryl, NH-acyl, N-(alkyl)$_2$, N-(aryl)$_2$, N-(alkyl)(aryl), $PH_2$, PH-alkyl, PH-aryl, PH-acyl, P-(alkyl)$_2$, P-(aryl)$_2$, P-(alkyl)(aryl); saturated hydrocarbons; unsaturated hydrocarbons; substituted hydrocarbons; heterocyclic compounds; carboxylic acids; carboxylic esters; amides; nitriles; and mixtures thereof.

34. The method as defined in claim 33 wherein the other of the second connecting group and the first connecting group is adapted to be a protectable group comprising at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitriles; and mixtures thereof;

wherein the at least one temporary protecting group is removably attached to the protectable group.

35. The method as defined in claim 34 wherein the at least one temporary protecting group is removed by at least one of thermal, chemical, and photochemical means.

36. The method as defined in claim 24 wherein each of the first connecting group and the second connecting group is adapted to be a protectable group comprising at least one of multivalent hetero atoms selected from the group consisting of C, N, O, S, and P; functional groups containing the hetero atoms and selected from the group consisting of SH, OH, $NH_2$, NH-alkyl, NH-aryl, NH-acyl, $PH_2$, PH-alkyl, PH-aryl, PH-acyl; saturated hydrocarbons; unsaturated hydrocarbons; substituted hydrocarbons; heterocyclic compounds; carboxylic acids; carboxylic esters; amides; nitriles; and mixtures thereof;

wherein the at least one temporary protecting group is removably attached to each protectable group.

37. The method as defined in claim 36 wherein the first connecting group temporary protecting group is a hydrophilic group comprising at least one of photo-labile acids, thermal-labile acids, chemical labile acids, derivatives thereof, and mixtures thereof.

38. The method as defined in claim 37 wherein at least one of the at least one of the photo-labile acids and thermal-labile acids comprises at least one of acid substituted benzyloxycarbonyl (BOC) derivatives, acid substituted 3,5-[(dimethoxybenzoinyl)oxy]carbonyl (DMO)-carbamate derivatives, acid substituted 2-nitrobenzyloxycarbonyl (N-BOC) derivatives, acid substituted N-nitroveratryloxycarbonyl (NCOC) derivatives, acid substituted 4-(4', 8'-dimethoxylnaphthylmethyl)benzenesulfonamide derivatives, acid substituted 3,4-dimethoxy-6-nitrobenzyl carbamate derivatives, substituted 3,4-dimethoxy-6-nitrobenzyl carbamate derivatives, and mixtures thereof.

39. The method as defined in claim 38 wherein the chemical labile acids comprise at least one of $-CO_2^-$, $-SO_3^-$, $-NH_3^+$, $-NHR_2^+$, $-NH_2R^+$, $-PyH^+$, carboxylic acids, carboxylic esters, amides, ketones, nitriles, $-OH$, $-CH=NOH$, and mixtures thereof.

40. The method as defined in claim 36 wherein the second connecting group temporary protecting group is a hydrophobic group comprising at least one of photo-labile acids having linear long end chains, thermal-labile acids having linear long end chains, chemical labile acids having linear long end chains, derivatives thereof, and mixtures thereof.

41. The method as defined in claim 40 wherein the linear long end chains comprise at least one of ester groups, ether groups, silyl ether groups, carbo-amide groups, and mixtures thereof.

* * * * *

UNITED STATES PATENT AND TRADEMARK OFFICE
CERTIFICATE OF CORRECTION

PATENT NO.         : 7,297,557 B2                                               Page 1 of 1
APPLICATION NO.    : 10/880482
DATED              : November 20, 2007
INVENTOR(S)        : Sean X. Zhang et al.

It is certified that error appears in the above-identified patent and that said Letters Patent is hereby corrected as shown below:

On the Title page, in field (75), in "Inventors", in column 1, line 1, delete "Sunnyvale" and insert -- Cupertino --, therefor.

In column 5, line 12, delete "nitrites" and insert -- nitriles --, therefor.

In column 5, line 29, delete "nitrites" and insert -- nitriles --, therefor.

In column 7, line 8, delete "nitrites" and insert -- nitriles --, therefor.

In column 7, line 11, delete "CGI" and insert -- CG1 --, therefor.

In column 10, line 62, delete "-$C_5H,_{11}$" and insert -- -$C_5H_{11}$ --, therefor.

In column 13, line 27, in Claim 8, delete "u-bond" and insert -- π-bond --, therefor.

Signed and Sealed this

Twenty-seventh Day of May, 2008

JON W. DUDAS
*Director of the United States Patent and Trademark Office*